United States Patent [19]

Mogi et al.

[11] 4,058,772

[45] Nov. 15, 1977

[54] METHOD OF AND APPARATUS FOR CONVERTING A PLURAL-BIT DIGITAL SIGNAL TO A PULSE WIDTH MODULATED SIGNAL

[75] Inventors: Takao Mogi, Tokyo; Akira Taki, Atsugi; Hiroshi Yamazaki, Ebina, all of Japan

[73] Assignee: Sony Corporation, Tokyo, Japan

[21] Appl. No.: 717,477

[22] Filed: Aug. 25, 1976

[30] Foreign Application Priority Data

Aug. 28, 1975 Japan ................................ 50-104446

[51] Int. Cl.$^2$ ............................................. H04B 1/06
[52] U.S. Cl. ................................... 325/464; 325/459; 332/1; 340/347 DA; 358/191; 178/68
[58] Field of Search ................. 332/1 R; 340/347 DA; 325/457-459, 464, 465, 468, 470; 358/191, 193; 178/68; 179/15 AW

[56] References Cited

U.S. PATENT DOCUMENTS

| | | | |
|---|---|---|---|
| 3,422,423 | 1/1969 | Kaszynski et al. | 340/347 DA |
| 3,576,575 | 4/1971 | Hellwarth et al. | 340/347 DA |
| 3,707,713 | 12/1972 | Diaz et al. | 340/347 DA |
| 3,968,440 | 7/1976 | Ehni | 325/464 X |

Primary Examiner—Robert L. Griffin
Assistant Examiner—Aristotelis M. Psitos
Attorney, Agent, or Firm—Lewis H. Eslinger; Alvin Sinderbrand

[57] ABSTRACT

A method of and apparatus for converting a plural-bit digital signal to a pulse width modulated signal which, thereafter, can be filtered to derive an analog signal level corresponding to the value of the digital signal. A periodic timing signal is produced and each period thereof is divided into predetermined sections. The value of the digital signal is divided by a factor equal to the number of predetermined sections, and the divided digital signal is converted into a corresponding pulse width modulated signal during each of the timing sections. The pulse width of the pulse width modulated signal in selected ones of the timing sections is selectively increased by a predetermined amount in the event that the divided digital value is not an integral number. In particular, the number of such timimg sections wherein the pulse width of the pulse width modulated signal is increased is equal to the remainder obtained after the value of the digital signal is divided.

9 Claims, 4 Drawing Figures

METHOD OF AND APPARATUS FOR CONVERTING A PLURAL-BIT DIGITAL SIGNAL TO A PULSE WIDTH MODULATED SIGNAL

BACKGROUND OF THE INVENTION

This invention relates to pulse width modulation techniques and, more particularly, to a method of and apparatus for converting a plural-bit digital signal to a corresponding pulse width modulated signal, the full duration of the pulse width being subdivided such that, if the pulse width modulated signal is smoothed to derive an analog level, the resultant analog level exhibits minimal ripple.

Pulse width modulating systems have been used for various applications. In a typical application, a pulse width modulator is used to convert, for example, an encoded digital signal into a corresponding pulse width modulated signal, and this pulse width modulated signal then can be used to produce an analog level corresponding to the encoded digital signal. For example, if the pulse width modulated signal is a recurrent signal, it can be filtered by a low-pass filter so that, at each recurrence thereof, a corresponding analog level is produced. Alternatively, the recurrent pulse width modulated signal can be transmitted through an integrator to derive the aforementioned corresponding analog level.

A pulse width modulator that can be used in a digital-to-analog conversion system of the type mentioned above finds ready application in an electronic tuner, such as a tuner used to select a particular channel in a television receiver or to select a particular station in, for example, an FM radio receiver. In this type of electronic tuner, a voltage-controlled variable reactance device, such as a varactor or variable capacitance diode, is employed as the tuning element, and the control voltage for the variable reactance device is derived from a digital signal representing the channel or station to which the tuner is to be tuned. A pulse width modulator can be used to so derive the analog control voltage from the digital signal.

In the typical pulse width modulator wherein a single variable-width pulse is produced during a predetermined period, this pulse generally being recurrent in successive periods, the relatively long intervals between pulses result in a significant ripple factor in the filtered analog voltage. When used in an electronic tuner of the type described above, this ripple factor can lead to an erroneous setting of the variable reactance device and, consequently, an improper tuning of the electronic tuner. If this ripple factor is reduced by, for example, increasing the filtering of the pulse width modulated signal, the effective time constant of the filter correspondingly is increased, thereby imparting a substantial delay between a change in the pulse width modulated signal and a corresponding change in the analog signal level. This delay also is a source of erroneous tuning of the electronic tuner.

It had been thought that both the ripple factor and time delay of the aforementioned prior art digital-to-analog converters using a pulse width modulator could be minimized if the frequency of the recurrent pulse width modulated signal is increased. However, if the frequency is increased, it follows that the period during which the pulse width is produced must decrease. This, in turn, limits the maximum width of the pulse width modulated signal; thereby limiting the range and sensitivity thereof. That is, the change in the width of the pulse in response to each incremental bit in the digital signal must be limited if the pulse width modulation frequency is increased. With this limitation, it becomes very difficult to discriminate accurately between slightly different pulse widths. Thus, an erroneous analog level may be produced, resulting in an erroneous tuning of the aforementioned electronic tuner.

OBJECTS OF THE INVENTION

Therefore, it is an object of the present invention to provide an improved method of and apparatus for converting a digital signal into a pulse width modulated signal.

Another object of this invention is to provide an improved method of and apparatus for producing an analog level corresponding to the value of a plural-bit digital signal.

A still further object of the present invention is to provide an improved method and apparatus for generating an analog level in response to a digital signal that overcomes the aforementioned problems inherent in prior art techniques.

Another object of this invention is to provide a method of producing an analog level in response to a digital signal using pulse width modulation techniques wherein the analog level exhibits only minimal ripple.

An additional object of this invention is to provide an improved digital-to-analog converter using pulse width modulation techniques wherein a pulse width modulated signal corresponding to the digital signal is filtered to an analog level without undue time delay.

A still further object of this invention is to provide an improved pulse width modulation system that produces an accurate pulse width representation corresponding to a digital signal, the pulse width representation being easily discriminated.

Various other objects, advantages and features of the present invention will become readily apparent from the ensuing detailed description, and the novel features will be particularly pointed out in the appended claims.

SUMMARY OF THE INVENTION

In accordance with the present invention, a method of and apparatus for converting a plural-bit digital signal to an analog level corresponding to the value of the digital signal is comprised of generating a periodic timing signal; dividing each period of the timing signal into $2^n$ predetermined sections; dividing the value of the digital signal by the factor $2^n$; converting the divided digital signal into a corresponding pulse width modulated signal during each of the $2^n$ sections; selectively increasing the pulse width modulated signal in selected ones of the sections by a predetermined amount in the event that the divided digital signal value is not an integral number; and filtering the pulse width modulated signal produced in all of the sections.

BRIEF DESCRIPTION OF THE DRAWINGS

The following detailed description, given by way of example, will best be understood in conjunction with the accompanying drawings in which.

DETAILED DESCRIPTION OF A CERTAIN PREFERRED EMBODIMENT

Although the pulse width modulator of the present invention admits of various applications, it will be particularly described in the environment of a digital-to-analog converter wherein a plural-bit digital signal first is converted to a corresponding pulse width modulated signal, and this latter signal then is converted to an analog level. Furthermore, this invention will be described in the particular application of a digital-to-analog converter used in an electronic tuner, such as the aforementioned television receiver tuning section.

Programmable Electronic Tuner

Figure 1:
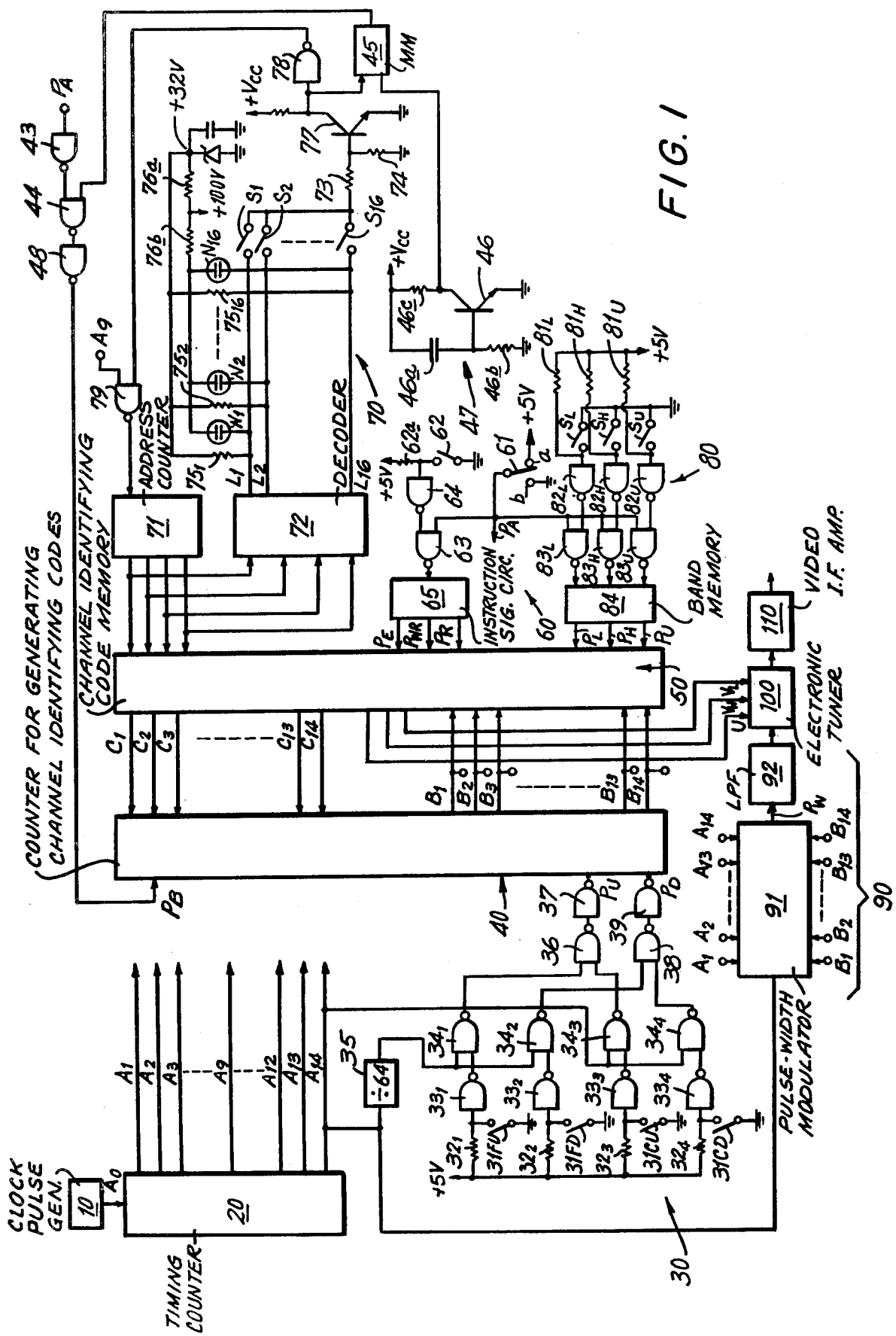
FIG. 1 is a block diagram illustrating one embodiment of a channel selecting apparatus wherein the present invention finds ready application.

Referring to FIG. 1, one embodiment of channel selecting apparatus comprises a clock pulse generator 10 that supplies clock pulses $A_o$ to a timing counter 20, the timing counter being a conventional counter responsive to clock pulses $A_o$ to produce a recirculating timing code $A_1, A_2, A_3 \ldots A_{14}$. A sweep pulse generating circuit 30 is manually controllable to selectively produce up-sweep pulses $P_U$ or down-sweep pulses $P_D$ in response to timing pulses $A_{14}$ produced by timing counter 20. An up-down counter 40 is provided to count the sweep pulses $P_U$ or $P_D$ in a programming mode of the apparatus to establish channel identifying digital codes $B_1, B_2, B_3 \ldots B_{14}$ corresponding to the changing counts of counter 40. These channel identifying codes may be selectively written at selected addresses in a memory 50. A memory control circuit 60 is adapted to selectively establish the programming mode of operation or a channel selecting mode in which a previously programmed channel is selected, as by reading out a channel identifying digital code previously written or stored at a selected address in memory 50, as indicated at $C_1, C_2, C_3 \ldots C_{14}$, with such read out code being applied to counter 40 for setting the counter to this count. A manually controllable address selecting circuit 70 is adapted to activate a selected address in memory 50 either for the writing in of a selected channel identifying code at such address or the reading out from such address of a previously stored channel identifying code. A band indicating signal forming circuit 80 is operable in the programming mode of operation to produce a signal indicating the band of the channel indicating code then being written into a selected address of memory 50. The band indicating signal also is written into the respective address.

The channel selecting apparatus shown in FIG. 1 also includes a digital-to-analog converter 90 which provides an analog control voltage for the variable reactance device, such as a varactor, of a selected band in an electronic tuner 100 in correspondence to the count of counter 40 established by a channel identifying digital code selectively read out of memory 50 in a channel selecting mode of the apparatus, or in correspondence to the changing counts of counter 40 produced when the counter counts sweep pulses from generating circuit 30 in the programming mode of the apparatus. A video intermediate frequency amplifier 110 receives the tuned frequency ouput of tuner 100 and operates in typical manner.

In the channel selecting apparatus as generally described above, the clock pulse $A_o$ from generator 10 may have a frequency of, for example, 4 MHz resulting in a period $\tau$ of 0.25 $\mu$ sec. In the timing counter 20, clock pulses $A_o$ are counted to produce timing pulses $A_1$ to $A_{14}$. The frequency of a given timing pulse is one-half its preceding pulse so that a sequence of frequency-halved pulses range from the pulses $A_1$ having a period of 0.5 $\mu$ sec. and a pulse width of 0.25 $\mu$ sec., to the pulses $A_{14}$ having a period of 4.096 m.sec. and a pulse width of 2.048 m.sec. The timing pulses $A_1, A_2 \ldots A_{14}$ thus form a 14-bit recirculating timing code. It will be apparent that such 14-bit circulating digital code changes its state $2^{14}$ times, that is, 16,384 times, within the recirculating or timing period of $T=2^{14}\tau=4.096$ m.sec.

In the sweep pulse generating circuit 30 as shown in FIG. 1, a fine up-sweep switch 31FU, a fine down-sweep switch 31FD, a coarse up-sweep switch 31CU and a coarse down-sweep switch 31CD are connected in series circuits with respective resistors $32_1$, $32_2$, $32_3$ and $32_4$, and such series circuits are connected in parallel between a voltage source and ground. The switches 31FU, 31FD, 31CU and 31CD are normally open, as shown, to provide signals at the relative high level, hereinafter used to designate a binary "1", at the junctions of such switches with the respective resistors $32_1$, $32_2$, $32_3$ and $32_4$. Further, the switches 31FU, 31FD, 31CU and 31CD are adapted to be selectively manually displaced to the closed condition thereof for providing a signal at the low level, hereinafter used to designate a binary "0", at the junction of the closed switch with the respective resistor $32_1$–$32_4$. Such binary signals "1" or "0" from switches 31FU, 31FD, 31CU and 31CD are applied through inverters $33_1$, $33_2$, $33_3$ and $33_4$ to first inputs of NAND circuits $34_1$, $34_2$, $34_3$ and $34_4$, respectively. The binary pulses $A_{14}$ having a period of 4.096 m.sec. are applied from timing counter 20, as coarse sweep pulses, to second inputs of NAND circuits $34_3$ and $34_4$. These timing pulses $A_{14}$ also are applied to a frequency divider 35 so as to be divided, for example, by 64, for providing fine sweep pulses having a period of 262.144 m.sec. and such fine sweep pulses are applied to second inputs of NAND circuits $34_1$ and $34_2$. The outputs of NAND circuits $34_1$ and $34_3$ are connected to first and second inputs of a NAND circuit 36 which has its output applied to an inverter 37 for producing either the fine or coarse up-sweep pulses $P_U$, while the outputs of NAND circuits $34_2$ and $34_4$ are similarly connected to first and second inputs of a NAND circuit 38 which has its output applied to an inverter 39 for producing either the fine or coarse down-sweep pulses $P_D$.

Figure 2:
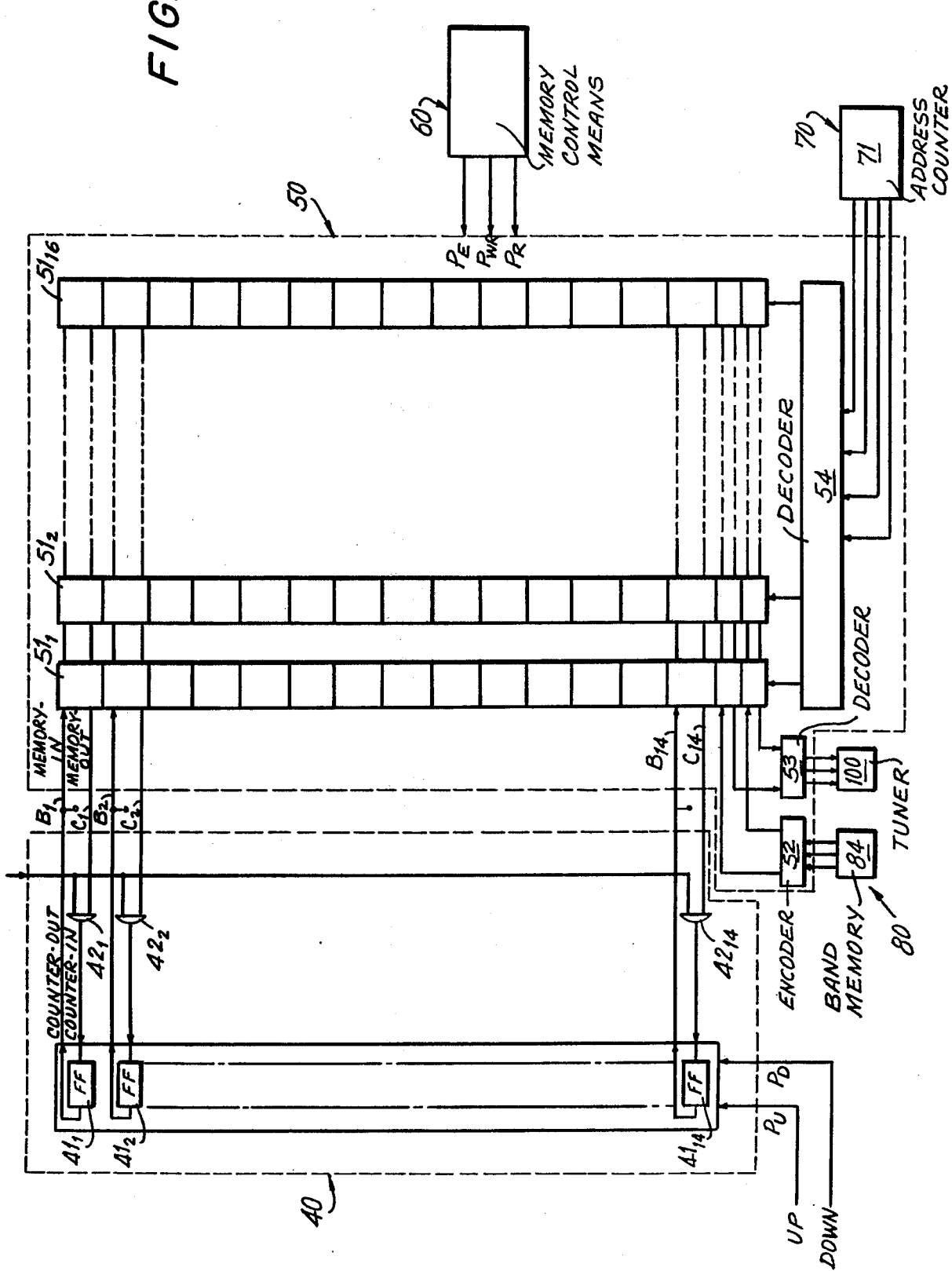
FIG. 2 is a block diagram illustrating, in greater detail, a portion of the channel selecting apparatus of FIG. 1.

As shown schematically in FIG. 2, counter 40 may be a conventional 14-bit up-down counter having 14 flip-flops $41_1, 41_2 \ldots 41_{14}$ whose states are changed sequentially in the up or down direction when counting the up-sweep pulses $P_U$ or the down-sweep pulses $P_D$, respectively, in the programming mode of operation. These changing states establish the respective bits of sequentially changing 14-bit channel identifying codes $B_1, B_2 \ldots B_{14}$. In the programming mode of operation, the channel identifying codes are applied from counter 40 to memory 50 for writing or storage of a selected one of such codes at a selectively activated address in the memory, and the channel identifying codes are also applied from counter 40 to digital-to-analog converter 90 for providing a corresponding control voltage for the varactor in a selected band of electronic tuner 100. Flip-flops $41_1$–$41_{14}$ of counter 40 are further adapted, in the channel selecting mode of operation, to have their respective states established by the respective bits $C_1$–$C_{14}$ of a stored channel identifying code which is read out from a selectively activated address in memory 50 through AND circuits $42_1$–$42_{14}$ when these AND circuits are energized by a load pulse $P_B$ during the channel selecting operation.

As also shown in FIG. 2, memory 50 may be formed of sixteen addressable memory units, or registers, $51_1$, $51_2$...$51_{16}$, with the memory unit at each address being capable of storing 16-bits of digital information, that is, the 14-bits of a selected channel identifying code as determined by counter 40 and 2-bits from an encoder 52 for the band indicating signal received from circuit 80 for indicating whether the channel identified by the 14-bit digital code is a vhf or uhf channel, and, if it is a vhf channel, whether it is a low channel or a high channel in such broadcast band, respectively. Further, the memory 50 is schematically shown to include a decoder 53 which, in the programming and channel selecting modes of operation, receives the 2-bits of digital information representing the band of the channel identified by the 14-bit code that is being written into or read out of the addressed unit 51, to apply a corresponding band identifying signal to electronic tuner 100 for selecting the corresponding vhf or uhf band. Finally, the memory 50 is schematically shown to include a decoder 54 which receives a 4-bit digital code from address selecting circuit 70, as hereinafter described, to address one memory unit $51_1$, $51_2$...$51_{16}$ corresponding to the 4-bit address code. Preferably, the memory units of memory 50 are composed of non-volatile cells, such as metal-nitride-oxide-silicon (MNOS) elements, so that the contents thereof, while being electrically alterable, are held unchanged during periods when memory 50 is disconnected from a source of power.

Returning again to FIG. 1, memory control 60 includes a mode change-over switch 61 having a movable contact that is manually actuable to selectively engage fixed contacts $a$ and $b$ Fixed contact $a$ is connected to a voltage source +5V so that, when the movable contact engages contact $a$, the programming mode of operation is established and a signal $P_A$ that is a binary "1" is obtained from switch 61. On the other hand, the fixed contact $b$ of switch 61 is connected to ground so that, when the movable contact engages contact $b$, the channel selecting mode of operation is established and a signal $P_A$ that is a binary "0" is obtained. Memory control 60 further includes a normally open switch 62 which is connected in series with a resistor $62a$ between a voltage source +5V and ground. The signal $P_A$ from mode change-over switch 61 is shown to be applied to one input of a NAND circuit 63 which has its other input connected through an inverter 64 to switch 62. When switch 62 is in its normally open position, as shown, inverter 64 will produce a binary "0", whereas, when switch 62 is manually closed to effect a write-in operation in the programming mode, inverter 64 will produce a binary "1". The output of NAND circuit 63 is applied to an instruction signal forming circuit 65 which is responsive to a binary "0" to supply an erasing pulse $P_E$ followed by a write-in pulse $R_{WR}$ to the particular memory unit that is being addressed in memory 50 so as to erase the previously stored contents in the addressed memory unit and, thereafter, to write into the addressed memory unit the 14-bit channel identifying code then being received from counter 40 plus the 2-bit code representing the band of the channel identified by the 14-bit code. Instruction signal forming circuit 65 is responsive to a binary "1" supplied by NAND circuit 63 to apply a read pulse $P_R$ to memory 50 so as to effect the read out of the contents stored in the memory unit which then is being addressed.

Band indicating signal forming circuit 80 includes normally open switches $S_L$, $S_H$ and $S_U$ which are connected in series with respective resistors $81_L$, $81_H$ and $81_U$ between a voltage source +5V and ground. Switches $S_L$, $S_H$ and $S_U$ are further connected to inverters $82_L$, $82_H$ and $82_U$, respectively, which have their outputs connected to first inputs of NAND circuits $83_L$, $83_H$ and $83_U$, respectively. The second inputs of these NAND circuits receive the signal $P_A$ from mode change-over switch 61 to selectively actuate band memory 84 which, in turn, applies a band indicating signal $P_L$, $P_H$ or $P_U$ to encoder 52 (FIG. 2) in memory 50. In the programming mode of operation, that is, when signal $P_A$ is a binary "1", the output of NAND circuit $83_L$, $83_H$ or $83_U$ is a binary "0" only when the respective switch $S_L$, $S_H$ or $S_U$ is manually closed, representing that the channel identified by the 14-bit code to be written into a selected address in memory 50 is a low vhf channel, a high vhf channel or a uhf channel, respectively.

Address selecting circuit 70 includes a plurality, for example, 16, normally open address selecting switches $S_1$, $S_2$...$S_{16}$ which are each selectively closed for selecting a corresponding one of the 16 addresses or memory units in memory 50 during a programming operation or channel selecting operation. Address selecting circuit 70 further includes neon tubes or other indicators $N_1$, $N_2$...$N_{16}$ corresponding to switches $S_1$, $S_2$...$S_{16}$, an address counter 71 which produces a 4-bit addressing code corresponding to the particular switch $S_1$–$S_{16}$ that is closed for addressing the corresponding memory unit in memory 50, and a decoder 72 which receives the coded output of address counter 71 to produce a binary "0" output signal on a respective one of 16 output lines $L_1$, $L_2$...$L_{16}$. The switches $S_1$–$S_{16}$ are connected, at one side, in common, through series resistors 73 and 74 to ground, while the opposite sides of switches $S_1$–$S_{16}$ are connected to lines $L_1$–$L_{16}$, respectively. Further, the lines $L_1$–$L_{16}$ are connected through resistors $75_1$–$75_{16}$, respectively, and a common resistor $76a$ to a voltage source +100V, while the neon tubes or indicators $N_1$–$N_{16}$ are connected between the lines $L_1$–$L_{16}$, respectively, and the same voltages source +100V through a common resistor $76b$.

A switching transistor 77 has its base electrode connected to resistors 73 and 74, its emitter electrode connected to ground and its collector electrode connected to a voltage source $+V_{cc}$ and to an inverter 78. The output of inverter 78 is connected to one input of a NAND circuit 79, the other input of which receives timing pulses $A_9$ produced by timing counter 20 and having a period of 0.128 m.sec. The output of NAND circuit 79 is applied to address counter 71 which counts each binary "0" produced by the NAND circuit.

Load pulse $P_B$ that is applied to AND circuits $42_1$–$42_{14}$ of counter 40 for reading out the channel identifying code $C_1$–$C_{14}$ from an addressed memory unit in memory 50 (FIG. 2), is produced by NAND circuit 44 and inverted by inverter 48. One input of this NAND circuit is supplied with the signal $P_A$ though inverter 43, and the other input of NAND circuit 44 is connected to the output of a monostable multivibrator 45 which is triggered by a binary "1" at the collector of transistor 77 or by a binary "1" at the collector of transistor 46 included in a time constant circuit 47. When signal $P_A$ is a binary "0", as during the channel selecting mode of operation, and monostable multivibrator 45 is triggered to produce a binary "1" pulse for a predetermined period of, for example, 50 m.sec., load pulse $P_B$ is produced.

The base electrode of transistor 46 in time constant circuit 47 is connected between a series-connected capacitor 46a and a resistor 46b, which are in series with the voltage source $+V_{cc}$. When the apparatus initially is connected to a power source, or turned on, transistor 46 is made conductive and its collector produces a binary "0". After a predetermined lapse of time, for example, 50 m.sec., the voltage at the junction between capacitor 46a and resistor 46b decays to turn off transistor 46 so that its collector output rises to a binary "1" level for triggering monostable multivibrator 45 which then provides its output pulse for the predetermined time of 50 m.sec.

Digital-to-analog converter 90 preferably includes a pulse-width modulator 91 operative to produce a chain of pulses at a predetermined repetition rate with the effective width of the pulses in repetitive timing durations being dependent on the channel identifying code $B_1, B_2 \ldots B_{14}$ obtained from counter 40. The recurring pulses from modulator 91 are supplied through a low-pass filter 92 for providing the analog control voltage for a variable reactance device in electronic tuner 100. Pulse-width modulator 91 will be described in greater detail below with respect to FIGS. 3 and 4.

Programming Mode of Operation

When it is desired to program the channel selecting apparatus, that is, to store at the various addresses in memory 50 channel identifying codes corresponding to various channels that are receivable in the region where the television receiver is located so that, thereafter, such channels can be received or selected merely by actuation of the switches $S_1-S_{16}$ corresponding to the respective addresses, mode change-over switch 61 is engaged with contact a for selecting the programming mode of operation and for providing a binary "1" signal $P_A$. If it is desired, for example, to store at the address or memory unit $51_1$ a channel identifying code corresponding to the receiving frequency for channel "2", address selecting switch $S_1$ is manually closed. The binary "1" at line $L_1$ of decoder 72 is applied through switch $S_1$ to turn ON transistor 77 in address selecting circuit 70. Thus, inverter 78 supplies a binary 1" to NAND circuit 79 which is conditioned to apply a binary "0" to address counter 71 in response to each timing pulse $A_9$ from timing counter 20. Address counter 71 counts each binary "0" applied thereto until the resulting 4-bit code from address counter 71 corresponds to the address or memory unit $51_1$ selected by the closing of switch $S_1$. At that time, decoder 72 decodes this particular 4-bit code from address counter 71 to provide a binary "0" on the corresponding output line $L_1$. This binary "0" on line $L_1$ turns OFF transistor 77 so that inverter 78 disables NAND circuit 79 with a binary "0" and address counter 71 ceases counting. Accordingly, the 4-bit address code corresponding to switch $S_1$ is applied to memory 50 for selecting or activating the address or memory unit $51_1$ corresponding to switch $S_1$.

Since channel "2" is a low vhf channel, switch $S_L$ of band indicating signal forming circuit 80 is closed to provide a binary "1" to NAND circuit $83_L$ through inverter $82_L$. It is recalled that $P_A$ is a binary "1" and, therefore, NAND circuit $83_L$ applies a binary "0" to band memory 84, whereby the band selecting pulse $P_L$ is supplied through encoder 52 and decoder 53 of memory 50 (FIG. 2) to provide the signal $V_L$ for selecting the low band or channel of the vhf tuning section in tuner 100.

Having selected the memory address at which a channel identifying code is to be programmed and the band or section of tuner 100 which is associated with the channel to be programmed, sweep pulse generating circuit 30 is made operative, for example, by closing coarse up-sweep switch 31CU. When switch 31CU is closed, inverter $33_3$ applies a binary "1" to NAND circuit $34_3$. Therefore, at each "0" level of timing pulse $A_{14}$ (which pulse has a period of 4.096 m.sec.), NAND circuit $34_3$ applies a binary "1" to NAND circuit 36. Since the fine up-sweep switch 31FU is open, inverter $33_1$ applies a binary "0" to NAND circuit $34_1$ which, in turn, supplies a constant binary "1" to NAND circuit 36. Therefore, when coarse up-sweep switch 31CU is closed, NAND circuit 36 applies a binary "0" to inverter 37 in response to each timing pulse $A_{14}$; whereupon an up-sweep pulse $P_U$ is applied to counter 40. These pulses $P_U$ now exhibit a short period of 4.096 m.sec. and, therefore, may be considered coarse up-sweep pulses which cause relatively rapid changes in the count of counter 40. The count of counter 40 thus is changed, in sequence, in the upward direction to similarly change the resulting channel identifying code $B_1, B_2 \ldots B_{14}$ obtained therefrom once during every period T of the timing code $A_1, A_2 \ldots A_{14}$, starting from the state (00000000000000) and incrementing toward a maximum state (11111111111111). As will be described below, the changing channel identifying code from counter 40 and the recirculating timing code from timing counter 20 are applied to pulse-width modulator 91 to obtain an analog level corresponding to the channel identifying code, in the programming mode of operation. Thus, so long as switch 31CU of sweep pulse generating circuit 30 is held in its closed condition, the channel selecting or control voltage from low pass filter 92 is increased progressively, for example, by about 2 m.V at every period T=4.096 m.sec. of the recirculating timing code, and hence the receiving frequency established by tuner 100 increases progressively.

When a video picture being broadcast by channel "2" appears on the screen of the television receiver, the coarse upsweep switch 31CU is released by the operator so as to return to its normal open condition. Upon opening of switch 31CU, the supplying of the coarse up-sweep pulses $P_U$ to counter 40 is terminated and the count then exhibited by counter 40 remains unchanged. This count represents the channel identifying code $B_1, B_2 \ldots B_{14}$ to determine the approximate value of the receiving frequency of tuner 100 for the desired channel. Thereafter, the fine up-sweep switch 31FU may be closed to provide fine up-sweep pulses $P_U$ from inverter 37, which fine up-sweep pulses have a period 64 times that of the coarse up-sweep pulses by reason of divider 35. That is, when switch 31FU is closed, NAND circuit $34_1$ is conditioned to supply the fine pulses $(A_{14} \div 64)$ through NAND circuit 36 and inverter 37. In counting the fine up-sweep pulses, counter 40 sequentially changes its count, and thus the resulting channel identifying code $B_1, B_2 \ldots B_{14}$, at every period $64T = 262.144$ m.sec. Thus, the channel selecting or control voltage from low pass filter 92 is increased by about 2 mV at every period 64T for similarly changing the receiving frequency determined by tuner 100.

When viewing of the picture on the screen of the television receiver indicates that fine tuning has been achieved in respect to the video signal broadcast by the desired channel, switch 31FU is released to return to its open condition and thereby halt the supplying of the fine up-sweep pulses to counter 40. Accordingly, counter 40 stops counting with the instantaneous count thereof representing the resulting channel identifying code $B_1, B_2 \ldots B_{14}$ corresponding to a value of the analog control voltage applied to tuner 100 corresponding to a receiving frequency for the fine-tuned reception of channel "2". Thereafter, write-in switch 62 is closed to supply a binary "1" to NAND circuit 63 which had been enabled, or conditioned, by the binary "1" of signal $P_A$. The binary "0" thus produced by NAND circuit 63 energizes instruction signal forming circuit 65 to supply an erasing pulse $P_E$ to memory 50 so as to erase any contents previously stored in the addressed memory unit $51_1$ (selected by the closing of switch $S_1$) and then to supply a write-in pulse $P_{WR}$ to memory unit $51_1$ to enable the channel identifying code $B_1, B_2 \ldots B_{14}$ of counter 40 and the band identifying signal $P_L$ from band memory 84 to be written into the respective cells of memory unit $51_1$.

Following the programming of memory unit $51_1$ with a channel identifying code and a band indicating code corresponding to channel "2", the other memory units $51_2$-$51_{16}$ of memory 50 may be similarly programmed with coded information corresponding to other vhf and/or uhf channels that are receivable in the region where the television receiver is located. Thus, for example, if it is desired to program memory unit $51_2$ with coded information corresponding to channel "4", change-over switch 61 is kept in engagement with its fixed contact $a$ for establishing the programming mode of operation, and address selecting switch $S_2$ is closed for addressing memory unit $51_2$. Since channel "4" is also a low vhf channel, switch $S_L$ of band indicating signal forming circuit 80 again is closed and, for example, coarse up-sweep switch 31CU of the sweep-pulse generating circuit is held in its closed position until counter 40, in counting the resulting up-sweep pulses, has changed the channel identifying code $B_1, B_2 \ldots B_{14}$ from the code that represented fine tuning of channel "2" to the code representing approximate tuning of channel "4". After the channel identifying code has been further modified by fine tuning, as described above, write-in switch 62 is again closed for effecting the writing into memory $51_2$ of the channel identifying and band indicating codes for the desired channel "4". Thus, at each of the addresses of memory 50 there can be sequentially written or stored the channel identifying and band indicating codes corresponding to a respective desired channel.

Although the programming of the channel selecting apparatus according to this invention has been described above as being effected by the sequential closing of the coarse up-sweep switch 31CU and the fine up-sweep switch 31FU, in which case, the coarse or fine up-sweep pulses $P_U$ are counted in the upward direction by counter 40 for progressively increasing the receiving frequency of tuner 100, it will be apparent that the programming operation can be similarly effected by the successive closing of the coarse down-sweep switch 31CD and the fine down-sweep switch 31FD so that counter 40 is made to count in the downward direction for progressively decreasing the receiving frequency of tuner 100. Whether counter 40 is made to count in the upward direction or in the downward direction, as aforesaid, is merely dependent upon the relationship of the receiving frequency for a channel which is to be programmed relative to the receiving frequency for the channel which has been previously programmed and, in each case, the direction in which counter 40 is made to count is selected so as to minimize the time required for the programming operation.

Channel Selecting Mode of Operation

After the programming of memory 50 has been completed, as described above, mode change-over switch 61 can be closed to its fixed contact $b$ and thereby provide the signal $P_A$ as a binary "0" for establishing the channel selecting mode of operation. This binary "0" signal $P_A$ disables NAND circuit $83_L$, $83_H$ and $83_U$, and also NAND circuit 63, thus de-energizing band indicating signal forming circuit 84 and instruction signal forming circuit 65 so that the latter supplies the reading pulse $P_R$ to memory 50.

Preferably, when the channel selecting apparatus is initially turned ON, address counter 71 of address selecting circuit 70 is reset thereby to produce a 4-bit code addressing memory unit $51_1$ in memory 50. This is obtained by initially turning ON transistor 46 in time constant circuit 47 so that its collector output is a binary "0" for a predetermined period of, for example, 50 m.sec., whereupon transistor 46 then is turned OFF to trigger monostable multivibrator 45. At this time, NAND circuit 44 is enabled by the inversion of signal $P_A$. Hence, the pulse from monostable multivibrator 45 energizes NAND circuit 44, resulting in load pulse $P_B$ for the period of the monostable multivibrator pulse. Load pulse $P_B$, when applied to AND circuits $42_1$-$42_{14}$ in counter 40 (FIG. 2), transmits the channel identifying code $C_1, C_2 \ldots C_{14}$ previously stored in memory unit $51_1$ to counter 40. At the same time, the band indicating code stored in the respective cells of memory unit $51_1$ is read out to decoder 53 so that, for example, the signal $V_L$ is applied to tuner 100 for selecting the low band of the vhf tuning section. During the duration of load pulse $P_B$, the bits $C_1$-$C_{14}$ of the read out channel identifying code are applied to the respective flip-flops $41_1$-$41_{14}$ of counter 40 with the result that such flip-flops are set for providing the channel identifying code $B_1$-$B_{14}$ from counter 40 to pulse-width modulator 91, whereby a control voltage for tuner 100 suitable for fine tuning of the receiving frequency to that of channel "2" (assumed to be stored in memory unit $51_1$) is produced.

Thereafter, if it is desired to receive a channel programmed in any other memory unit of memory 50, for example, if it is desired to receive channel "4" programmed in memory unit $51_2$, as described above, switch $S_2$ of address selecting circuit 70 is closed and, as previously described in connection with the programming mode of operation, address counter 71 counts the pulses $A_9$ until the 4-bit code from address counter 71 reaches the count corresponding to the address of the second memory unit $51_2$. When this count is reached, decoder 72 applies a binary "0" to output line $L_2$ so that transistor 77 is turned OFF and its collector output rises from a binary "0" level to a binary "1" level. Such rise in the collector output of transistor 77 triggers monostable multivibrator 45 and, as previously described, the output from monostable multivibrator 45 results in the production of a load pulse $P_B$ that is applied to counter 40. In response to the load pulse $P_B$, the channel identifying code being read out of memory unit $51_2$ correspondingly changes the states of the flip-flops of counter 40 so that the latter supplies the corresponding channel identifying code $B_1, B_2 \ldots B_{14}$ to pulse width modulator 91. Therefore, the control voltage applied to tuner 100 is sufficient to cause the tuner to establish the receiving frequency for channel "4".

It will be apparent that the channels programmed in the other memory units $51_3-51_{16}$ may be similarly selectively received merely by closing a respective one of the address selecting switches $S_1-S_{16}$.

Pulse Width Modulator

Figure 3:
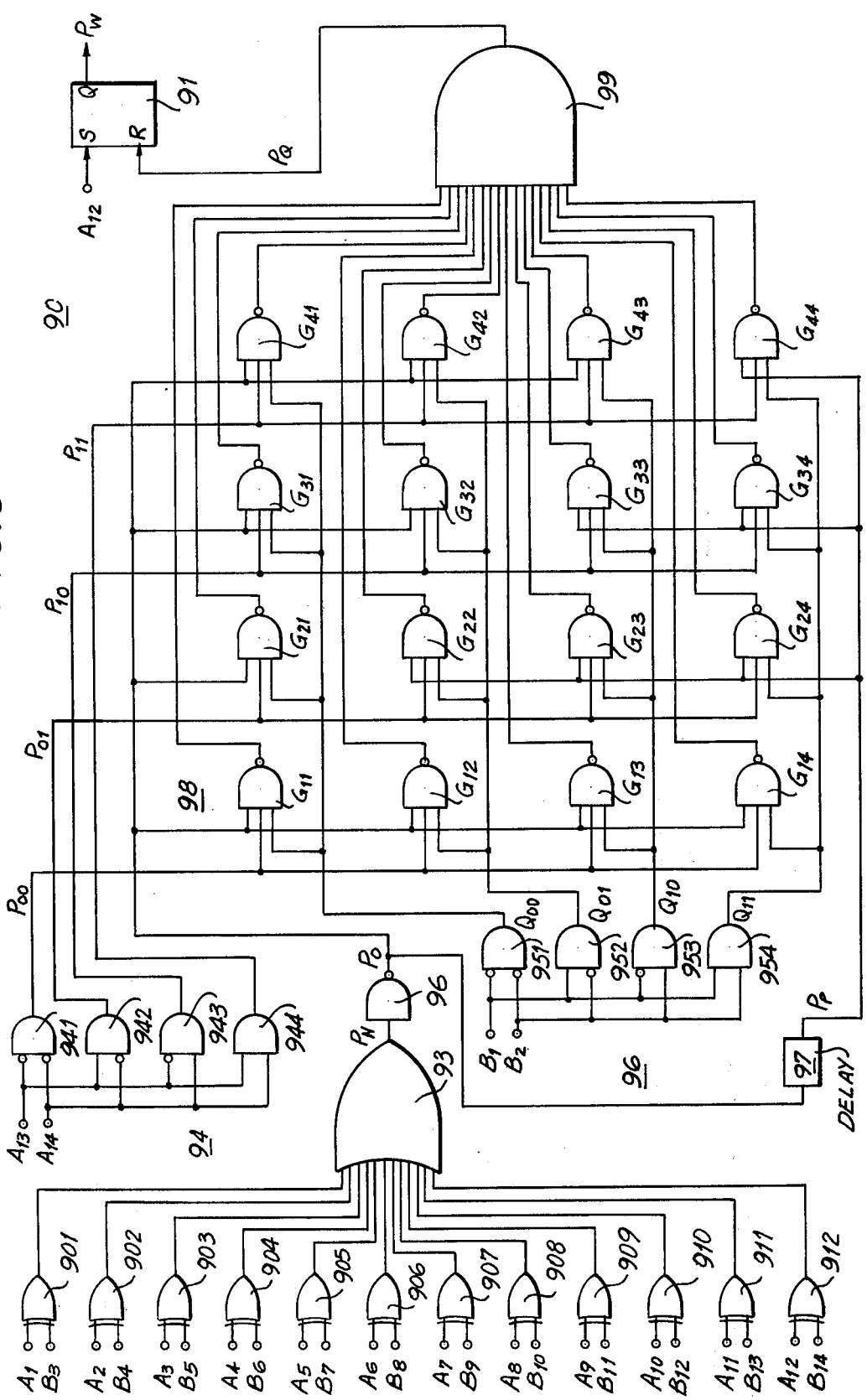
FIG. 3 is a logic diagram of the pulse width modulator used in accordance with the teachings of the present invention.

Referring now to FIG. 3, there is illustrated a logic diagram of a preferred embodiment of pulse width modulator 90. The purpose of this pulse width modulator is to produce an output pulse $P_W$ having a duration that is proportional to the channel identifying code $B_1-B_{14}$ provided by counter 40. This variable width pulse $P_W$ is produced during each timing period $T = 4.096$ m sec. That is, the effective width of pulse $P_W$ is produced during the period of timing pulse $A_{14}$. However, as noted hereinabove, the interval extending between the termination of pulse $P_W$ in one timing period and the start of the next pulse $P_W$ in the next timing period may result in undersired ripple in the analog control voltage supplied by filter 92 to tuner 100. The pulse width modulator 90 shown in FIG. 3 overcomes this drawback and, additionally, produces a pulse width modulated signal that can be filtered to a control voltage by a filter having a smaller time constant than heretofore, thus increasing the response time of the electronic tuning apparatus.

Pulse width modulator 90 includes a converting section formed of exclusive-OR-circuits 901, 902 . . . 911, 912 to which a portion of the channel identifying code $B_1-B_{14}$ is applied, and which is adapted to convert this code into a corresponding time duration referenced to the recirculating timing code $A_1-A_{14}$. In particular, the two lower order bits $B_1$ and $B_2$ of the channel identifying code are not applied to the exclusive-OR circuits. By excluding these two lower order bits, the numerical value of the channel identifying code effectively is divided by $2^2$, or 4. Thus, the converted time duration produced by exclusive-OR circuits 901-912 is approximately one-fourth of the total time duration represented by all of the bits $B_1-B_{14}$ in the channel identifying code. As will be described, the pulse width signal produced in response to bits $B_3-B_{14}$ is provided in each of four successive predetermined sections, each section having a period equal to 1.024 m sec., the period of the timing pulses $A_{12}$. Then, depending upon whether the numerical value of the divided bits $B_3-B_{14}$ is an integral number, the pulse width in some of the successive predetermined timing sections is selectively increased. The sum of the resultant pulse width signals produced in the four successive timing sections is equal to the pulse width signal that would have been produced in response to the channel identifying code in a single period $T = 4.096$ m sec.

Bits $B_3-B_{14}$ of the channel identifying code are compared to timing pulses $A_1-A_{12}$, respectively, of the recirculating timing code in the respective exclusive-OR circuits 901-912. As is known, an exclusive-OR circuit produces a binary "1" only if the respective binary signals applied thereto differ. If the applied binary signal are equal, for example, if both are a binary "1" or if both are a binary "0", the exclusive OR circuit produces a binary "0". Thus, as the timing code $A_1-A_{12}$ sequentially changes, as discussed hereinabove in respect to timing counter 20, a particular timing code will be reached that is equal, bit-for-bit, to the channel identifying code bits $B_3-B_{14}$. At that time, and only at that time, will each of exclusive OR circuit 901-912 produce a binary "0". At all other times, it is expected that at least one of the bits $A_1-A_{12}$ in the recirculating timing code will not be equal to a corresponding one of the bits $B_3-B_{14}$ in the channel identifying code. Hence, at all other times, at least one of exclusive OR circuits 901-912 will produce a binary "1".

The outputs of all of exclusive OR circuits 901-912 are coupled to an OR circuit 93 which is adapted to produce a pulse $P_N$ whenever any one of exclusive OR circuit 901-912 produces a binary "1", this pulse terminating at the time that the recirculating timing code is equal, bit-for-bit, to bits $B_3-B_{14}$ of the channel identifying code. The output of OR circuit 93 is inverted by inverter 96 to produce a pulse $P_O$, and this pulse $P_O$ is supplied through a delay circuit 97 to produce a pulse $P_P$ that is delayed with respect to pulse $P_O$ by a predetermined minimum delay $\tau$. This delay period $\tau$ is equal to a minimum pulse width corresponding to the pulse width of timing pulse $A_1$. For the purpose of the present invention, the delay $\tau$, and thus the width of timing pulse $A_1$, is equal to 0.25 $\mu$ sec.

The period T of timing pulse $A_{14}$, which is equal to 4.096 m sec., is divided into four equal timing sections by a timing circuit 94. Circuit 94 is comprised of individual AND circuits 941, 942, 943 and 944 having their respective inputs connected in common to receive timing pulses $A_{13}$ and $A_{14}$, respectively. AND circuit 941 includes two inverting inputs, as shown, and is adapted to produce a binary "1" pulse $P_{00}$ at the time that timing pulse $A_{13}$ and $A_{14}$ both are a binary "0", as shown more particularly by the waveform diagram at FIG. 4J. AND circuit 942 is adapted to produce a binary "1" pulse $P_{01}$ at a time that timing pulse $A_{13}$ is binary "1" and timing pulse $A_{14}$ is a binary "0". Accordingly, AND circuit 942 includes one inverting input to which the timing pulse $A_{14}$ is applied. Similarly, AND circuit 943 is adapted to produce a binary "1" pulse $P_{10}$ at a time that the timing pulse $A_{13}$ is a binary "0" and timing pulse $A_{14}$ is a binary "1". Accordingly, AND circuit 943 includes one inverting input coupled to receive timing pulse $A_{13}$. Finally, AND circuit 944 is adapted to produce a binary "1" pulse $P_{11}$ at a time that timing pulses $A_{13}$ and $A_{14}$ both are a binary "1". Hence, AND circuit 944 does not include any inverting input. The resultant timing sections $P_{00}$, $P_{01}$, $P_{10}$ and $P_{11}$ are mutually exclusive and are shown in waveform FIG. 4J, K, L, M, respectively. Thus, it may be appreciated that circuit 94 effectively serves to divide the period T (equal to 4.096 m sec.) into four equal timing sections, each such section having a duration equal to 1.024 m sec. Since this duration (1.024 m sec) is equal to the period of timing pulses $A_{12}$, it is seen that the timing code formed of bits $A_1-A_{12}$ will change sequentially from (000000000000) to (111111111111) during each of these timing sections.

Pulse width modulator 90 additionally includes a circuit 95 adapted to determine the numerical value of the two lower order bits $B_1$ and $B_2$ included in the channel identifying code. Since only two lower order bits here are under consideration, it is recognized that they may have following numerical value:

| $B_1$ | $B_2$ | Value |
|---|---|---|
| 0 | 0 | 0 |
| 1 | 0 | 1 |
| 0 | 1 | 2 |
| 1 | 1 | 3 |

Circuit 95 is comprised of AND circuits 951, 952, 953 and 954 having their respective inputs connected in common to receive bits $B_1$ and $B_2$, respectively. AND circuit 951 is adapted to produce an output pulse $Q_{00}$, representing the numerical value 0, when both bits $B_1$ and $B_2$ are a binary "0". Accordingly, AND circuit 951 includes two inverting inputs. AND circuit 952 is adapted to produce an output signal $Q_{01}$ when the numerical value of bits $B_1$ and $B_2$ is equal to 1. Accordingly, one input of AND circuit 952 is connected for receiving bit $B_1$ when this bit is a binary "1", and the other input of this AND circuit is an inverting input connected to receive bit $B_2$ when this latter bit is a binary "0".

AND circuit 953 is adapted to produce a signal $Q_{10}$ representing the numerical value 2, and, therefore, includes one input that is connected as an inverting input to receive the bit $B_1$ when this bit is a binary "0", and includes a second input connected to receive bit $B_2$ when this latter bit is a binary "1". Finally, AND circuit 954 is adapted to produce a signal $Q_{11}$ representing the numerical value 3 when bits $B_1$ and $B_2$ both are a binary "1".

A matrix array 98, for example, a 4 × 4 array of AND circuits, is adapted to determine which, if any, of the pulse width signals supplied by OR circuit 93 is to be increased, or stretched, during selected timing sections, in accordance with the numerical value of bits $B_1$ and $B_2$. This arry of AND circuits is formed of respective columns $G_{11}$–$G_{14}$, $G_{22}$–$G_{24}$, $G_{31}$–$G_{34}$, and $G_{41}$–$G_{44}$, each column being associated with a respective timing section determined by the pulses $P_{00}$, $P_{01}$, $P_{10}$ and $P_{11}$, respectively. Thus, one input of each AND circuit $G_{11}$–$G_{14}$ is connected to receive the signal $P_{00}$, one input of each AND circuit $G_{21}$–$G_{24}$ is connected to receive the signal $P_{01}$, one input of each of AND circuits $G_{31}$–$G_{34}$ is connected to receive the signal $P_{10}$, and one input of each AND circuit $G_{41}$–$G_{44}$ is connected to receive the signal $P_{11}$.

The array 98 also is formed of respective rows of AND circuits, each row being associated with a corresponding numerical value of bits $B_1$ and $B_2$, as determined by signals $Q_{00}$–$Q_{11}$, respectively. Thus, one input of each of AND circuits $G_{11}$, $G_{21}$, $G_{31}$ and $G_{41}$ is connected to receive the signal $Q_{00}$. One input of each of AND circuits $G_{12}$, $G_{22}$, $G_{32}$ and $G_{42}$ is connected to receive the signal $Q_{01}$. One input of each of AND circuits $G_{13}$, $G_{23}$, $G_{33}$ and $G_{43}$ is connected to receive the signal $Q_{10}$. Finally, one input of each of AND circuits $G_{14}$, $G_{24}$, $G_{34}$ and $G_{44}$ is connected to receive the signal $Q_{11}$.

It is recalled that the numerical value of bits $B_1$ and $B_2$ may be considered the remainder when the higher order bits $B_3$–$B_{14}$ of the channel identifying code are divided by the factor 4. If the numerical value of bits $B_1$ and $B_2$ is 0, then the divided channel identifying code bits is an integral number. Hence, there is no need to increase the pulse width signal produced in response to bits $B_3$–$B_{14}$ during the respective timing sections defined by pulse signals $P_{00}$, $P_{01}$, $P_{10}$ and $P_{11}$, respectively. However, if the numerical value of bits $B_1$ and $B_2$ is 1, then one of the pulse width signals produced during the aforementioned timing sections should be increased by the minimum duration $\tau$. Similarly, if the numerical value of bits $B_1$ and $B_2$ is 2, then the pulse width signal produced during two timing sections should be increased by $\tau$. Finally, if the numerical value of bits $B_1$ and $B_2$ is 3, then the pulse width signal produced during three of the aforementioned timing sections each should be increased by the amount $\tau$. This selective increase in the respective pulse width signals produced during the timing sections defined by pulse signals $P_{00}$, $P_{01}$, $P_{10}$ and $P_{11}$ is carried out by applying the pulse width signal $P_O$ produced by inverter 96 to all of AND circuits $G_{11}$–$G_{14}$ associated with pulse signal $P_{00}$, only AND circuit $G_{21}$ included in the column associated with pulse signal $P_{01}$, AND circuits $G_{31}$ and $G_{32}$ included in the column associated with pulse signal $P_{10}$, and AND circuits $G_{41}$, $G_{42}$ and $G_{43}$ included in the column associated with pulse signal $P_{11}$. Conversely, the remaining AND circuits are supplied with the delayed pulse width signal $P_P$, as shown.

Each of the AND circuits included in array 98 includes an inverting output terminal. Thus, a binary "0" is produced by at least one of these AND circuits during each timing section defined by pulse $P_{00}$, $P_{01}$, $P_{10}$ and $P_{11}$ when all of the inputs to that AND circuit are provided with a binary "1". At all other times, that AND circuit produces a binary "1". Each of the outputs of the AND circuits included in array 98 is connected to an AND circuit 99, and the output of this latter AND circuit is connected to the reset input of a flip-flop circuit 91. As may be appreciated, AND circuit 99 produces a binary "1" signal $P_Q$ when all of the AND circuits included in array 98 produce a binary "1", and this $P_Q$ falls to a binary "0" when any one of the AND circuits included in array 98 produces a binary "0".

Flip-flop circuit 91 is a conventional negative-edge triggered flip-flop circuit whose set input is coupled to receive the timing pulse $A_{12}$. Since the period of timing pulse $A_{12}$ is one-fourth the period T established by the timing pulse $A_{14}$, it is appreciated that flip-flop circuit 91 is set in response to the negative transition in timing pulse $A_{12}$ at the start of each of the aforementioned timing sections. When this flip-flop circuit is set, the pulse $P_W$ is provided at its Q output, and when the flip-flop circuit is reset by the negative transition in signal $P_Q$, the pulse $P_W$ terminates.

The operation of the pulse width modulator shown in FIG. 3 now will be described. For the purpose of simplifying the following explanation, it will be assumed that the channel identifying code supplied by counter 40 is (00000000000111). It is appreciated that the numerical value of this channel identifying code is 7. Hence, when this numerical value is divided by 4, the resultant is not an integral number.

Figure 4:
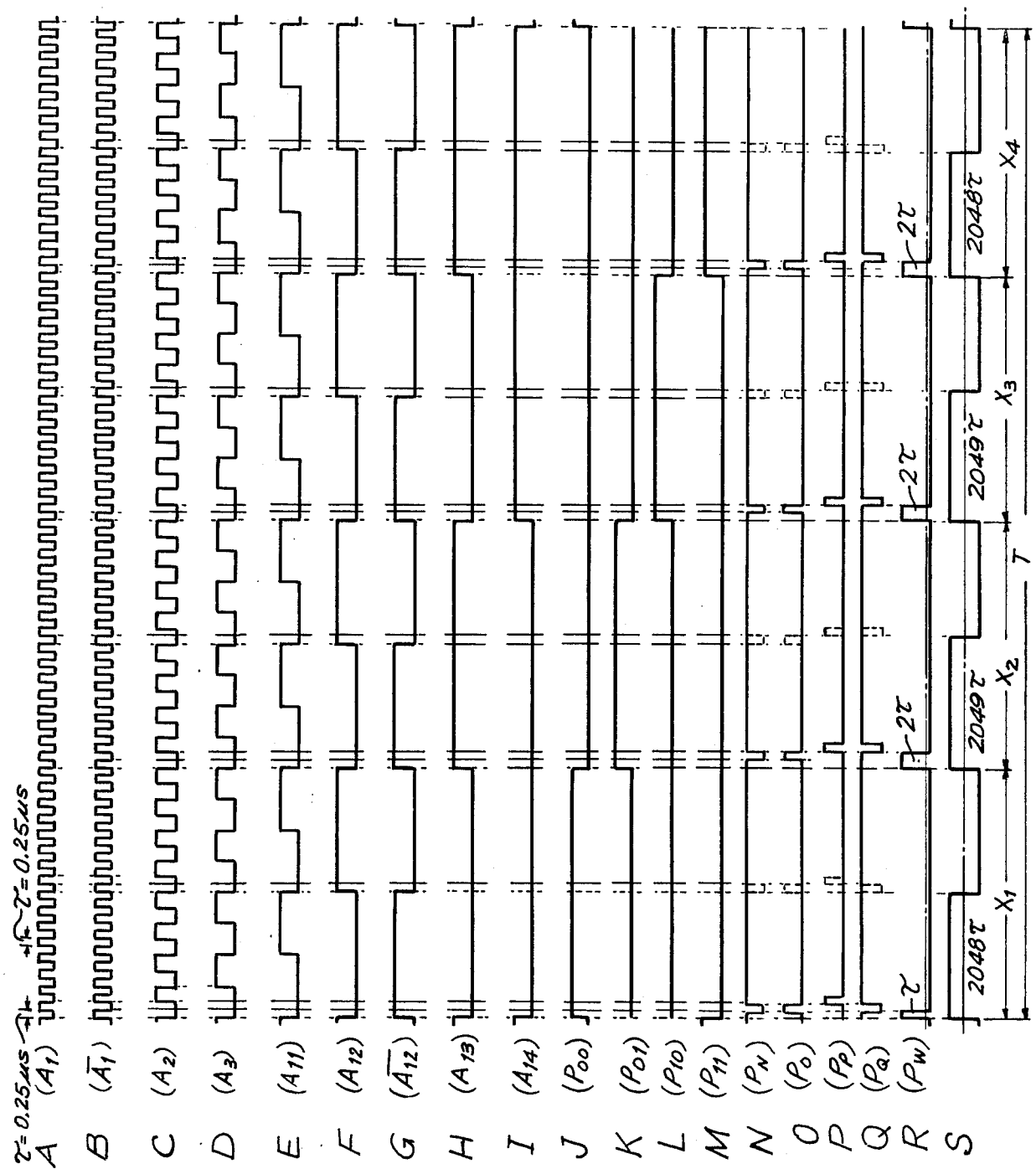
FIG. 4 is a waveform diagram to which reference will be made in explaining the operation of the pulse width modulator shown in FIG. 3.

Bits $B_3$–$B_{14}$ are compared to bits $A_1$–$A_{12}$ in the recirculating timing code by exclusive OR circuits 901–912, respectively. As an example, some of the bits in the timing code are shown in the waveform diagrams of FIGS. 4A–4G. It should be understood that the time scale for bits $A_1$, $A_2$ and $A_3$ is greatly expanded with respect to the time scale for the remaining bits in this timing code. It is recalled that each timing section, designated $X_1$, $X_2$, $X_3$ and $X_4$ in FIG. 4, commences with the negative transition of timing pulse $A_{12}$ and extends for the duration of the $A_{12}$ period, as shown. Thus, during each timing section $X_1$-$X_4$, the timing code bits $A_1$-$A_{12}$ cycle from (000000000000) to (111111111111). At the start of, for example, section $X_1$, the negative transition in timing pulse $A_{12}$ sets flip-flop circuit 91 to produce pulse $P_W$, as shown in FIG. 4R. Immediately following this negative transition in timing pulse $A_{12}$, each of the respective timing pulses $A_1$-$A_{12}$ is a binary "0". Then, at the first positive transition of timing pulse $A_1$, that is, at a time $\tau$ following the negative transition timing pulse $A_{12}$, the timing code is equal to (000000000001). It is appreciated that, in accordance with the above-assumed example, this timing code corresponds bit-for-bit with bits $B_3$-$B_{14}$ of the channel identifying code. Hence, each of exclusive OR circuits 901-912 supplies a binary "0" to OR circuit $P_N$, as shown in FIG. 4N, and this signal is inverted by inverter 96 to produce pulse $p_0$. Therefore, it is seen that the positive transition in pulse $P_0$ is separated from the negative transition in timing pulse $A_{12}$ by the width $\tau$. Of course, at the transition in timing pulse $A_1$, the timing code represented by bits $A_1$-$A_{12}$ will not be identical bit-for-bit with the channel identifying code bits $B_3$-$B_{14}$. Rather, at least one or more of exclusive OR circuits 901-912 will produce a binary "1" which is transmitted through OR circuit 93 as the signal $P_N$ to terminate pulse $P_0$ as shown in FIG. 4O.

Pulse $P_0$ is applied to AND circuit 99 through array 98. However, since the numerical value of bits $B_1$ and $B_2$ (11) for this assumed example is 3, then, as described hereinabove, the pulse width signal $P_0$ will be increased in three of the four timing sections $X_1$-$X_4$ during the timing period T. In particular, since the numerical value of bits $B_1$ and $B_2$ is 3, the signal $Q_{11}$ is produced by AND circuit 954. This signal enables each of AND circuits $G_{14}$, $G_{24}$, $G_{34}$ and $G_{44}$ for energization during the successive timing sections $X_1$, $X_2$, $X_3$ and $X_4$ as defined by pulses $P_{00}$, $P_{01}$, $P_{10}$ and $P_{11}$, as shown in FIGS. 4J-4M.

During the first timing section $X_1$, AND circuit $G_{14}$ is enabled by pulse signal $P_{00}$ to transmit the pulse width signal $P_0$ to AND circuit 99. That is, at the time that pulse width signal $P_0$ is produced, all of the inputs to AND circuit $G_{14}$ are a binary "1", resulting in a binary "0" supplied thereby to AND circuit 99. This results in pulse signal $P_Q$ that is coincident with pulse width signal $P_0$, this signal $P_Q$ thus resetting flip-flop circuit 91. Hence, the pulse width modulated signal $P_W$ that had been initiated at the negative transition of timing pulse $A_{12}$, as shown in FIG. 4R, now is terminated by the negative transition of pulse $P_Q$.

During the remaining positive and negative durations defined by timing pulse $A_1$ in timing section $X_1$, at least one of exclusive OR circuits 901-912 will produce a binary "1", thereby preventing further generation of pulse width signal $P_0$ during this section $X_1$. However, during the following section $X_2$, the pulse width signal $P_0$ again will be produced when the timing code corresponds bit-for-bit with the channel identifying code, as applied to exclusive OR circuits 901-912. Thus, pulse width signal $P_0$ will be produced at the same time relative to the negative transition in timing pulse $A_{12}$ during section $X_2$ as was produced during section $X_1$ and described in detail above. However, as shown in FIG. 3, this pulse width signal $P_0$ is not applied to an AND circuit that is enabled by the signal $Q_{11}$ during section $X_2$ as defined by the pulse signal $P_{01}$. That is, during timing section $X_2$, the numerical value 3 of bits $B_1$ and $B_2$ serves to enable AND circuit $G_{24}$ which functions to transmit the delayed pulse width signal $P_P$ to AND circuit 99. As shown in FIG. 4P, the delayed pulse width signal $P_P$ is delayed by a minimum width $\tau$ with respect to pulse width signal $P_0$. When this delayed pulse width signal $P_P$ is applied to AND circuit $G_{24}$, this AND circuit applies a binary "0" to AND circuit 99, resulting in the pulse $P_Q$ as shown in FIG. 4Q during timing section $X_2$. The negative transition in pulse $P_Q$ resets flip-flop circuit 91 which previously had been set in response to the negative transition in timing pulse $A_{12}$. Thus, for the timing section $X_2$, pulse width modulated signal $P_W$ has a pulse width equal to $2\tau$.

The foregoing operation is repeated during the remaining timing sections $X_3$ and $X_4$, the AND circuits $G_{34}$ and $G_{44}$ being enabled by signal $Q_{11}$ during these respective timing sections. Hence, the delayed pulse width signal $P_P$ is transmitted through AND circuit $G_{34}$ and $G_{44}$ during the remaining time sections $X_3$ and $X_4$, resulting in a pulse width modulated signal $P_W$ having the respective durations during timing sections $X_3$ and $X_4$ as shown in FIG. 4R.

The numerical value of the channel identifying code as provided by counter 40 was assumed to be 7. When the respective pulse width modulated signals $P_W$ produced during the corresponding timing sections $X_1$-$X_4$ are taken in combination, it is seen that the sum of the pulse width is equal to $(1+2+2+2)\tau$, or $7\tau$. This, of course, is equal to the correct pulse width representation of the channel identifying code whose numerical value is 7. However, rather than produce a single pulse of width $7\tau$ during a period T, the present invention, as discussed above, divides the period T into four equal sections $X_1$-$X_4$ and produces a pulse width modulated signal $P_W$ during each of these sections. Since the numerical value 7 of the channel identifying code, when divided by the number of timing sections 4, is not an integral number, it is appreciated that the pulse width modulated signal produced during the respective sections cannot be equal. However, if the numerical value of the channel identifying code is, for example, 4 (000000000100), then the pulse width modulated signal $P_W$ produced during each section $X_1$-$X_4$ will have the pulse width $\tau$. Similarly, if the numerical value of the channel identifying code is 8 (000000001000), then the pulse width modulated signal $P_W$ will have the equal pulse width $2\tau$ in each timing section $X_1$-$X_4$. In similar manner, if the numerical value of the channel identifying code is 12, the pulse width modulated signal $P_W$ will have a pulse width equal to $3\tau$ in each timing section $X_1$-$X_4$, and so on.

In another example, let it be assumed that the channel identifying code $B_1$-$B_{14}$ is (10000000000010), wherein the lower order bits $B_1$ and $B_2$ are binary "0" and binary "1", respectively. As described above, pulse width modulator signal $P_W$ is initiated at the negative transition of timing pulse $A_{12}$. This negative transition also initiates the first timing section $X_1$.

The above-assumed channel identifying code bits $B_3$-$B_{14}$ will correspond bit-for-bit to the timing code at the time that timing pulse $A_{12}$ is a binary "1" and the remaining timing bits $A_1$-$A_{11}$ all are binary "0". At this time, a binary "0" is produced by all of the exclusive OR circuits 901-912, resulting in a negative pulse $P_N$, as shown in broken lines in FIG. 4N. As before, this pulse $P_N$ is inverted to a positive pulse width signal $P_0$, shown in broken lines in FIG. 4O, and this pulse width signal $P_0$ is delayed by the amount $\tau$ to produce the delayed pulse width signal $P_P$ as shown in broken lines in FIG. 4P.

In this assumed example, the numerical value of bits $B_1$ and $B_2$ is 2, resulting in the binary "1" signal $Q_{10}$ to enable each of AND circuits $G_{13}$, $G_{23}$, $G_{33}$ and $G_{43}$ during the respective timing sections $X_1$-$X_4$. During the first timing section $X_1$, the undelayed pulse width signal $P_0$ energizes AND circuit $G_{13}$ to provide a binary "0" to AND circuit 99, thereby producing the pulse $P_Q$ shown in broken lines during timing section $X_1$ at FIG. 4Q. The negative transition of pulse $P_Q$ resets flip-flop circuit 91 to terminate the pulse width modulated signal $P_W$ as shown in FIG. 4S. Hence, this pulse width modulated signal produced during timing section $X_1$ in response to the channel identifying code assumed hereinabove has a pulse duration equal to 2048$\tau$.

During the next timing section $X_2$, pulse width modulated signal $P_W$ is initiated at the negative transition of timing pulse $A_{12}$, as before. Also, during timing section $X_2$, pulse width signal $P_0$ is produced at the same time relative to the negative transition of timing pulse $A_{12}$, as shown in broken lines in FIG. 4O, and the delayed pulse width signal $P_P$ is delayed from signal $P_0$ by the interval $\tau$. Now, during timing section $X_2$, AND circuit $G_{23}$ is energized by the delayed pulse width signal $P_P$ to supply a binary "0" to AND circuit 99, resulting in the pulse $P_Q$ to reset flip-flop circuit 91 as shown respectively by broken lines in FIG. 4Q and in FIG. 4S. Thus, the pulse width modulated signal $P_W$ produced during the timing section $X_2$ differs from the pulse width modulated signal $P_W$ produced during the timing section $X_1$ by one minimum interval $\tau$.

During the next timing section $X_3$, AND circuit $G_{33}$ is energized by the delayed pulse width signal $P_P$ to produce the pulse $P_Q$ as shown in broken lines in FIG. 4Q during the timing section $X_3$. This pulse $P_Q$ terminates the pulse width modulated signal $P_W$ as shown in FIG. 4S, resulting in a pulse duration of this signal $P_W$ equal to 2049$\tau$.

Finally, during timing section $X_4$, AND circuit $G_{43}$ is enabled by the signal $Q_{10}$, and is energized in response to the pulse width signal $P_0$, resulting in the pulse width modulated signal $P_W$ shown in FIG. 4S, having a pulse duration equal to 2048$\tau$.

It is seen that the duration of the pulse width modulated signal produced by the pulse width signal $P_0$ is increased by the minimum interval $\tau$ during two of the four timing sections, thus corresponding to the numerical value 2 of lower order bits $B_1$ and $B_2$ of the channel identifying code.

It is believed that the foregoing detailed description of the pulse width modulator shown in FIG. 3 will enable one of ordinary skill in the art to readily follow its operation in response to other examples of channel identifying codes. Therefore, in the interest of brevity and simplification, further examples of the operation of the pulse width modulator in response to additional channel identifying codes is not provided.

While the foregoing description has assumed that only the two lower order bits $B_1$ and $B_2$ are separated from the channel identifying code $B_3$-$B_{14}$ and processed separately, the present invention need not be limited solely to this embodiment. It should be appreciated that a lesser number of exclusive OR circuits may be provided to correspondingly divide the numerical value of the channel identifying code by a greater factor. That is, if the channel identifying code is represented as an $x$-bit signal, then $x-n$ exclusive OR circuits may be provided, wherein $n$ is less than $x$, and $n$ represents the lower order bits of the channel identifying code. The $x-n$ higher order bits of the channel identifying code are compared to the $x-n$ lower order bits of the recirculating timing code in order to determine the effective time duration of the pulse width signal $P_0$. If the timing period T, for example, the period of the timing pulse $A_{14}$, is divided into $2^n$ sections, then the pulse width signal $P_0$ will be delayed in respective sections depending upon the numerical value of the $n$ lower order bits of the channel identifying code. Stated otherwise, a pulse width modulated signal $P_W$ will be produced during each of the $2^n$ timing sections, the width of this pulse width modulated signal corresponding to the numerical value of the $x-n$ higher order channel identifying bits, and depending upon the numerical value of the $n$ lower order channel identifying bits, the width of the pulse width modulated signal $P_W$ will be enlarged by a predetermined amount $\tau$ during selected ones of the $2^n$ timing sections.

When the foregoing general description is applied to the particular embodiment shown in FIG. 3, it is seen that $n$ is equal to 2, $x$ is equal to 14 and $x-n$ is equal to 12. Let it be assumed that a numerical value $m$ is equal to the numerical value of the entire channel identifying code with the further assumption that the two lower order bits $B_1$ and $B_2$ both are 0. Since the timing period T is divided into $2^n = 2^2$, or 4, sections, then the numerical value of the $x-n$ higher order bits during each section is $m/4$, and the pulse width modulated signal $P_W$ produced during each such section has its width corresponding to the value $m/4$. If the numerical value of the 2 lower order channel identifying bits is equal to 1, then the pulse width modulated signal $P_W$ produced during one of the timing sections $X_1$-$X_4$ will have a duration $((m/4) + 1)\tau$. The duration of the pulse width modulated signal in each of the remaining timing sections merely is $(m/4)\tau$. Similarly, if the numerical value of the 2 lower order channel identifying bits is 2, then the pulse width modulated signal produced during two timing sections will have the duration $((m/4) + 1)\tau$, while the pulse width modulated signal in the remaining timing sections will have the duration $(m/4)\tau$. Finally, if the numerical value of the 2, lower order channel identifying bits is 3, then the width of the pulse width modulated signal produced during three of the timing sections will be equal to $((m/4) + 1)\tau$. For the example wherein $n=2$, and wherein the numerical value of the entire channel identifying code (assuming that the 2 lower order bits are 0) is $m$, and if the minimum duration of a pulse width modulated signal $P_W$ produced during each timing section is $\tau$, then the following table is explanatory of the illustrated apparatus.

| $B_2$ | $B_1$ | Pulse width at section $X_1$ | Pulse width at section $X_2$ | Pulse width at section $X_3$ | Pulse width at section $X_4$ | Total pulse width within period T |
|---|---|---|---|---|---|---|
| 0 | 0 | $\frac{m}{4}\tau$ | $\frac{m}{4}\tau$ | $\frac{m}{4}\tau$ | $\frac{m}{4}\tau$ | $m\tau$ |
| 0 | 1 | $\frac{m}{4}\tau$ | $(\frac{m}{4} + 1)\tau$ | $\frac{m}{4}\tau$ | $\frac{m}{4}\tau$ | $(m + 1)\tau$ |

-continued

| $B_2$ | $B_1$ | Pulse width at section $X_1$ | Pulse width at section $X_2$ | Pulse width at section $X_3$ | Pulse width at section $X_4$ | Total pulse width within period T |
|---|---|---|---|---|---|---|
| 1 | 0 | $\frac{m}{4}\tau$ | $(\frac{m}{4}+1)\tau$ | $(\frac{m}{4}+1)\tau$ | $\frac{m}{4}\tau$ | $(m+2)\tau$ |
| 1 | 1 | $\frac{m}{4}\tau$ | $(\frac{m}{4}+1)\tau$ | $(\frac{m}{4}+1)\tau$ | $(\frac{m}{4}+1)\tau$ | $(m+3)\tau$ |

As shown in FIG. 1, the pulse width modulated signal $P_W$ is supplied through low-pass filter 92 to produce a corresponding analog voltage that is applied to the variable reactance device in electronic tuner 100. This analog control voltage exhibits minimal ripple. Hence, if desired, the time constant of low-pass filter 92 may be decreased to thereby increase the response time of the overall tuning system.

While the present invention has been particularly shown and disclosed with respect to a preferred embodiment thereof, it should be particularly apparent that various changes and modifications in form and details can be made by one of ordinary skill in the art without departing from the spirit and scope of the invention. For example, whereas a relatively higher voltage level has been assumed to represent a binary "1" and a relatively lower voltage level has been assumed to represent a binary "0", these representations can be reversed. Furthermore, while AND and OR circuits have been described above, the functions performed by the respective AND and OR circuits can be performed equivalently by NAND and NOR logic, as is known. Still further, alternative comparator circuitry can be substituted for exclusive OR circuits 901-912 in order to determine the corresponding pulse width associated with the numerical value of an applied digital signal. Therefore, it is intended that the appended claims be interpreted as including the foregoing as well as other such changes and modifications.

What is claimed is:

1. A method of converting a plural-bit digital signal to an analog level corresponding to the value of said digital signal, comprising the steps of generating a periodic timing signal; dividing each period of said timing signal into $2^n$ predetermined sections; dividing said value of said digital signal by the factor $2^n$; converting said divided digital signal into a corresponding pulse width modulated signal during each of said $2^n$ sections; selectively increasing the pulse width modulated signal in selected ones of said sections by a predetermined amount in the event that said divided digital signal value is not an integral number; and filtering the pulse width modulated signal.

2. The method of claim 1 wherein said digital signal is an x-bit signal and said steps of dividing and converting comprise generating a recirculating timing code during each of said $2^n$ sections of said periodic timing signal, said timing code having $x-n$ bits; comparing the $x-n$ higher order bits of said digital signal to said recirculating timing code during each said section; and generating a pulse commencing at the start of each said section and terminating at a time during said section when said recirculating timing code corresponds to said $x-n$ higher order bits of said digital signal.

3. The method of claim 2 wherein said step of selectively increasing comprises detecting the numerical value of the $n$ lower order bits of said digital signal; and delaying the termination of said pulse by said predetermined amount in a number of sections corresponding to said numerical value of said $n$ lower order bits.

4. A method of converting an x-bit digital signal to an equivalent pulse width modulated signal having an effective pulse width during a predetermined time period that corresponds to the numerical value of said x-bit digital signal, comprising the steps of dividing said timing period into $2^n$ sections, wherein $n$ is less than $x$; generating a pulse during each of said $2^n$ sections having a duration corresponding to the numerical value of said x-bit digital signal divided by $2^n$ with the assumption that the $n$ lower order bits of said digital signal are each 0; detecting the numerical value of said $n$ lower order bits; and increasing the duration of the pulses generated in a number of said sections equal to the numerical value of said $n$ lower order bits by an amount corresponding to the lowest numerical value of said digital signal.

5. Apparatus for generating a pulse width modulated signal corresponding to the value of a plural-bit digital signal, comprising input means for receiving a plural-bit digital signal; timing means for generating $2^n$ timing signals of predetermined duration, the sum of said durations of said $2^n$ timing signals defining a period during which said pulse width modulated signal is generated; pulse width converting means coupled to said input means for converting the plural-bit digital signal less the lower order $n$ bits thereof into a corresponding pulse width signal during each timing signal duration; and means for selectively increasing by a predetermined amount the pulse width of said pulse width signals produced during selected ones of said timing signal durations in accordance with the value of said lower order $n$ bits, whereby the sum of all the pulse width modulated signals produced during said $2^n$ timing signal durations corresponds to the value of said plural-bit digital signal.

6. The apparatus of claim 5 wherein said pulse width converting means comprises means for generating a sequential, plural-bit recirculating code during each said timing signal duration; comparator means for comparing said plural-bit digital signal less said lower order $n$ bits thereof to said recirculating code to produce a comparison signal when said plural-bit digital signal less said lower order $n$ bits thereof corresponds to said recirculating code; and means for initiating a pulse signal at the start of each said timing signal duration and for terminating said pulse signal in response to said comparison signal.

7. The apparatus of claim 6 wherein said pulse width increasing means comprises delay means coupled to said comparator means for delaying said comparison signal by a predetermined time interval; means for determining the numerical value of said lower order $n$ bits; and means for terminating said pulse signal in response to the delayed comparison signal in predetermined timing signal durations depending upon said numerical value of said lower order $n$ bits.

8. The apparatus of claim 7 wherein said means for terminating said pulse signal in response to the delayed comparison signal comprises $2^n$ groups of gates, each group being responsive during a respective timing signal duration, and each group being comprised of $2^n$ gates; each gate in a group being responsive to a respective numerical value of said lower order $n$ bits; means for supplying said delayed comparison signal to selected ones of said $2^n$ gates in respective groups; and means for supplying said comparison signal to the remaining ones of said gates; whereby a particular gate is actuated in each group during each timing signal duration either by said comparsion signal or said delayed comparison signal depending upon said numerical value of said lower order $n$ bits, said actuated gate terminating said pulse signal.

9. In channel selecting apparatus for a television receiver having a tuner with a voltage-controlled, variable reactance device as its tuning element and means for producing an $x$-bit digital signal representative of a channel to which said tuner is to be tuned, a system for applying a control voltage to said variable reactance device corresponding to said $x$-bit digital signal, comprising input means for receiving said $x$-bit digital signal; timing means for generating $2^n$ timing signals of predetermined duration where $n$ is less than $x$; pulse width converting means coupled to said input means for converting the $x-n$ higher order bits of said digital signal into a corresponding pulse width signal during each timing signal duration; means for determining the numerical value of the $n$ lower order bits of said digital signal; means for selectively increasing by a predetermined minimum pulse width the width of said pulse width signal produced during selected timing signal durations, said selected timing signal durations being a function of said determined numerical value of said $n$ lower order bits; filter means for receiving each pulse width signal during each timing signal duration for producing an analog voltage proportional to the sum of the widths of said pulse width signals; and means for applying said analog voltage to said variable reactance device.

* * * * *